US008340575B2

(12) United States Patent
Kato

(10) Patent No.: US 8,340,575 B2
(45) Date of Patent: Dec. 25, 2012

(54) COMMUNICATION SYSTEM

(75) Inventor: Yasuo Kato, Hiratsuka (JP)

(73) Assignee: Kaiser Technology, Inc., Hiratsuka-shi, Kanagawa (JP)

(*) Notice: Subject to any disclaimer, the term of this patent is extended or adjusted under 35 U.S.C. 154(b) by 1538 days.

(21) Appl. No.: 11/883,363

(22) PCT Filed: Jan. 25, 2006

(86) PCT No.: PCT/JP2006/001103
§ 371 (c)(1),
(2), (4) Date: Jul. 31, 2007

(87) PCT Pub. No.: WO2006/085438
PCT Pub. Date: Aug. 17, 2006

(65) Prior Publication Data
US 2010/0062709 A1    Mar. 11, 2010

(30) Foreign Application Priority Data

Feb. 9, 2005  (JP) ................................ 2005-032527

(51) Int. Cl.
*H04B 5/00* (2006.01)

(52) U.S. Cl. ...................... 455/41.1; 455/41.2; 455/41.3; 343/788

(58) Field of Classification Search ................. 455/41.1, 455/41.2, 41.3; 343/788
See application file for complete search history.

(56) References Cited

U.S. PATENT DOCUMENTS 5,280,641 A * 1/1994 Ishii et al. .................. 455/182.3
2005/0264427 A1* 12/2005 Zeng et al. .................... 340/635

FOREIGN PATENT DOCUMENTS

| JP | 60-114774 | 6/1985 |
| JP | 5-291046 | 11/1993 |
| JP | 2001-76598 | 3/2001 |
| JP | 2001-298425 | 10/2001 |
| JP | 2001-352298 | 12/2001 |
| JP | 2003-163444 | 6/2003 |
| JP | 2004-282733 | 7/2004 |

* cited by examiner

*Primary Examiner* — Tuan H Nguyen
(74) *Attorney, Agent, or Firm* — Bacon & Thomas, PLLC

(57) ABSTRACT

Stable receiving action is achieved with a receiver of simpler configuration.
When a human hand is held over the panel unit 201, the electric field in the vicinity of the human body is coupled to the sensor electrode 2122 of the coil sensor 212 from the receiving electrode 211 of the panel unit 201, and alternate current is generated at the sensor electrode 2122. This alternate current then induces a magnetic flux inside the central opening of the coil 2121 in proportion to the strength of the electric field in the vicinity of the human body. Depending on the changes in this magnetic flux, electric current passes through the coil 2121. The electric current passing through the coil 2121 is converted by the electric current detecting circuit 2124 of the coil sensor 212 to voltage signals and transmitted as received signals to the demodulator 22. As a result, the received signals corresponding to the electric field in the vicinity of the human body, namely the transmission signals applied by the transmitter 1 to the human body, are obtained.

12 Claims, 5 Drawing Sheets

COMMUNICATION SYSTEM

TECHNICAL FIELD

The present invention relates to a communication system using electro-magnetic field for communication. Particularly, it relates to a communication system, which communicates by using electro-magnetic field induced in the human body.

BACKGROUND ART

The communication systems known as using an electro-magnetic field induced in the human body include a communication systems comprising a transmitter, in which voltage signals generated by modulating communication information is applied to the human body by capacitance coupling to induce an electric field in the vicinity of the human body, and a receiver, in which the strength of the electric field induced by the human body is detected and the strength of the electric field is demodulated into communication information (refer to patent documents 1, 2 and 3).

In these communication systems the electric field strength in the receiver is detected by coupling the electric field in the vicinity of the human body with electro-optic crystal via electrode located near the human body as changes in polarization characteristics of the electro-optic crystal (Patent documents 1 and 2), or from the output from FET (Field Effect Transistor) with its gate connected with the electrodes located under the electric field in the vicinity of the human body (Patent document 3).

[Patent Document 1]
Japanese Patent Application Laid-Open Publication No. 2001-298425
[Patent Document 2]
Japanese Patent Application Laid-Open Publication No. 2001-352298
[Patent Document 3]
Japanese Patent Application Laid-Open Publication No. 2004-282733

DISCLOSURE OF THE INVENTION

Object to be Achieved by the Invention

When the technology to detect the electric field strength by means of the aforementioned electro-optic crystal is used, a laser apparatus is necessary, in addition to the electro-optic crystal itself, for measuring polarization characteristics of the electro-optic crystal. Consequently, the receiver will be of complicated structure and more costly.

On the other hand, when the technology to install the FET with a gate connected with the electrode located in the electric field in the vicinity of the human body, the gate voltage is strayed from the FET ground so that it's operating range is not assured. Consequently no stable communications action can be expected.

Also, since the electric field noise generated by various electric products is relatively high in the general environment, any of the aforementioned technology to detect electric field induced in the human body may not ensure stable communications in some cases.

The object of the present invention, therefore, is to achieve stable receiving action in a communication system which conducts communications by using electro-magnetic field generated in the human body, with a simpler receiver configuration.

Means for Achieving the Object

In order to achieve the foregoing object, the communication system of the present invention comprises a transmitter, which applies transmission signals produced by modulating communication information to a conductive transmission medium and induces an electric field in the vicinity of the aforementioned transmission medium, and a receiver, which detects the strength of the electric field induced by the transmission medium and demodulates the detected electric field strength into the communication information, wherein the receiver is equipped with an electric field detecting unit for detecting the strength of electric field induced by the transmission medium, and the said electric field detecting unit is configured with a receiving electrode, which the transmission medium comes close to or contact during communication between the transmitter and the receiver, a coil(s), a sensor electrode arranged near the central opening of the aforementioned coil, a conductive cable connecting the receiving electrode and the sensor electrode, and a circuit for outputting signals indicating the strength of electric field based on the electric current induced in the coil.

Such communication system, with a receiver of extremely simple and low-cost configuration, can detect the changes in the electric field strength more stably, than the receiver, in which a magnetic flux induced by the electric current generated by the electric field at the sensor electrode, etc., is detected by using coils, and the strength of electric field is detected as changes in polarization characteristics of electro-optic crystal.

It is preferable here that such communication system has a magnetic core placed as being inserted in the central opening of the coil in the electric field detecting unit, and that the sensor electrode is placed on the end face of the magnetic core as being adhered to the said end face.

This can improve the sensitivity of the electric field detecting unit.

Also, in this case, for example, the sensor electrode may be equipped with a sealant having a higher magnetic permeability than that of air to seal the entire or periphery of the sensor electrode on the magnetic core.

This may reduce leakage of magnetic flux to the outside of coils and improve the sensitivity of the electric field detecting unit.

Alternately, for example, it is possible that plural pairs made of the magnetic body core and the coil wounded around the said magnetic body are mounted, and the sensor electrode is adhered to the end face of the magnetic core of each aforementioned pair as being sandwiched between (surrounded by) the end faces of the magnetic body core of each pair made of the magnetic body core and the coil wounded around the said magnetic body.

This may also reduce leakage of magnetic flux to the outside of coils and improve the sensitivity of the electric field detecting unit.

Also, in order to achieve the foregoing object, the present invention constitutes the communication system, which comprises a transmitter, which applies transmission signals produced by modulating communication information to the conductive transmission medium and induces an electro-magnetic field in the vicinity of the transmission medium, and a receiver, which detects the strength of the electro-magnetic field induced by the transmission medium and demodulates the detected electro-magnetic field strength into the communication information, wherein the receiver is equipped with an electro-magnetic field detecting unit for detecting the strength of electro-magnetic field induced by the transmission medium, and the said electro-magnetic detecting unit is configured with a coil(s) and a sensor electrode placed near the central opening of the said coil, and which the transmission medium comes close to or contact during communications between the transmitter and the receiver, and a circuit for outputting signals indicating the strength of electro-magnetic field based on the electric current generated in the coil.

The use of such transmission system can realize stable communications in a simpler configuration without using a receiving electrode.

In such communication system, it is also preferable to provide a magnetic body core placed as being inserted into the central opening of the coil of the electro-magnetic field detecting unit, wherein the sensor electrode is placed on the end face of the aforementioned magnetic body core as being adhered to the said end face.

This can further improve the sensitivity of the electromagnetic strength detecting unit.

Here, the transmission medium in the above communication system can be either human body or living body.

Also, in order to achieve the forgoing object, the present invention constitutes the communication system, comprising a transmitter, which applies transmission signals produced by modulating communication information to a living body and induces a static electro-magnetic field or an induced electro-magnetic field in the vicinity of the living body, and a receiver, wherein the receiver is equipped with a magnetic field detecting unit for detecting the strength of the magnetic field component of the electro-magnetic field induced by the living body, and the magnetic detecting unit is configured with a magnetic field sensor, which the transmission medium comes close to or contact during communications between the transmitter and the receiver, and a magnetic field strength signal generating circuit which outputs signals indicating the strength of the magnetic field component based on the output from the magnetic field sensor. Here, as the magnetic field sensor, a loop antenna can be used, for example.

Since such communication system uses the magnetic field with less ambient noise rather than the electric field, for the transmission from a living body to the receiver, communications will be more stable than that using electric field.

Effect of Invention

As mentioned above, the present invention can provide stable receiving action in the communication system, which uses the electro-magnetic field induced in the human body for communications, with a simpler configuration of the receiver.

BEST MODE FOR CARRYING OUT THE INVENTION

An embodiment of the communication system of the present invention is described below with an example of its application to the human body communication system.

To begin with, the first embodiment of this invention is explained. FIG. 1a shows the functional configuration of the communication system related to the embodiment of the present invention.

As shown in FIG. 1a, the communication system is configured by the transmitter 1 and the receiver 2, which communicate via the antenna body 3.

Also, the transmitter 1 has the transmitting side data processing unit 11, which generates communication information, which is to be transmitted to the receiver 2, the modulator 12, which modulates communication information and outputs it as transmission signals, and the transmitting electrode 13, which applies transmission signals to the antenna body 3. The receiver 2 has the signal receiving unit 21, which detects the strength of electric field induced by the antenna body 3 and outputs it as received signals, the demodulator 22, which demodulates the received signals into communication information and the receiving side data processing unit 23, which processes demodulated communication information. Also, the signal receiving unit 21 of the receiver 2 has the receiving electrode 211 and the coil sensor 212.

The external appearance of the transmitter 1 is shown in FIG. 1b.

As shown in the figure, the transmitter 1 has the transmitter main frame unit 101, which houses the transmitting side data processing unit 11, the modulator 12 and the transmitting electrode 13, and the band 102, with which the transmitter main frame unit 101 is wrist-worn, as shown in FIG. 1c. As shown in the cross-sectional view of the transmitter main frame unit 101 in FIG. 1d, the transmitting electrode 13 is, is mounted on the backside of the main frame unit as covered by the non-conductive cover 103 so that the electrode 13 comes close to the human arm when the transmitter main frame unit 101 is attached to the arm. This configuration ensures that the transmitting electrode 13 and the human body are capacitance-coupled when the transmitter is attached to the human arm.

The external appearance of the receiver 2 is shown in FIG. 1e.

As shown in the figure, the receiver 2 has the panel unit 201 housing the receiving electrode 211, and the receiver main frame unit 202 housing the coil sensor 212, the demodulator 22 and the receiving side data processing unit 23. The receiving electrode 211 is mounted, as shown in the top view of the panel unit 201 in FIG. 1f and the cross-sectional view of the panel main frame unit 201 in FIG. 1g, on the front side of the panel unit 201 as covered by the non-conductive cover 203 so that the human hand can be held over and come close to the receiving electrode. This configuration ensures that the electric field in the vicinity of the human body acts upon the receiving electrode 211 when the human hand is held over the panel unit 201.

Next, the configuration of the coil sensor 212 of the signal receiving unit 21 of the receiver 2 is schematically shown in FIG. 2a.

As shown in the figure, the coil sensor 212 has the coil 2121 with its ferrite-made core 2120 being inserted in the central opening, the copper-made sensor electrode 2122 fixed on the end face of the top of the core 2120 and the sealant 2123 with a relatively high magnetic permeability to seal the sensor electrode 2122 on the end face of the core 2120, wherein the sensor 2122 is connected with the receiving electrode 211 via conductive wire. As the sealant 2123, epoxy resin mixed with magnetic powder and others can be used.

Also, the coil sensor 212 has the current detecting circuit 2124, which converts the current passing through the coil 2121 to voltage signals. In the figure, this current detecting circuit 2124 is composed of the FET 2125, in which the electric current passing through the coil 2121 is used as gate signals, the resistance 2127 for converting source-drain electric current of the FET 2125 passing through having the strength corresponding to the gate signals to electric voltage by the electric power 2126, the condenser 2128 for adjusting the frequency property of the coil condenser 212, and others.

The action of such communication system is explained below.

The communication information generated by the transmitting side data processing unit 11 is AM-modulated by the modulator 12, using, for example, carrier wave with the amplitude of 2V and the frequency of 1 MHz, and outputted to the transmitting electrode 13. The transmission signals are then applied from the transmitting electrode via capacitance-coupling to a human body. The human body functions as the antenna body 3 and induces a static or induced electro-magnetic field, the strength of which corresponds to the transmitting signals, in the vicinity of the human body.

On the other hand, when the human hand is held over the panel unit 201 in the receiver 2, the electric field in the vicinity of the human body is coupled to the sensor electrode 2122 of the coil condenser 212 via the receiving electrode 211 of the panel unit 201. This generates alternate current at the sensor electrode 2122, and then induces a magnetic flux in the central opening of the coil 2121 corresponding to the strength of the electric field in the vicinity of the human body. Then, the electric current passes through the coil 2121 corresponding to such changes in the magnetic flux, and this electric current passing through this coil 2121 is converted by the electric current detecting circuit 2124 of the coil sensor 212 to voltage signals and sent as received signals to the demodulator 22. As a result, the signals corresponding to the electric field in the vicinity of the human body, namely the transmission signals of the transmitter 1, can be obtained as the received signal.

The demodulator 22 demodulates the received signals by AM-demodulation to communication information and transmits the information to the receiving side data processing unit 23. And, the receiving side data processing unit 23 processes the transmitted the communication information.

The action of the communication system relating to the first embodiment of the present invention has been explained above.

Here, the sealant 2123 in the coil sensor 212 is provided to improve the sensitivity of detecting the magnetic flux in the coil 2121.

FIG. 3 shows the experiment conducted to demonstrate the effect of this sealant 2123.

As shown in FIG. 3a, a sign wave with the amplitude of 2V and the frequency of 1 MHz is outputted as transmission signals to the transmitting electrode 13. Then, by assuming the electric wire 302 covered by insulating material as a human body, the transmission signals are applied from the transmitting electrode 13 via capacitance coupling to one end of the electric wire 302. And, at the other end of the electric wire 302, the electric field generated around the electric wire 302 is received by the receiving electrode 211 and coupled to the coil sensor 212. The output from the coil sensor 212 is observed with the oscilloscope 303.

The results of such experiment have revealed that when no sealant 2123 was provided as in FIG. 3b1, the amplitude of the output from the coil sensor 212 was 1.10V as shown in FIG. 3b2, whereas when the sealant 2123 was mounted to cover only the periphery of the sensor electrode 2122 as shown in FIG. 3c1, the amplitude of the output from the coil sensor 212 was 1.38V as shown in FIG. 3c2. When the sealant 2123 was provided to cover the entire sensor electrode 2122 as shown in FIG. 3d1, the amplitude of the output from the coil sensor 212 was 1.48V as shown in FIG. 3d2.

And these experiment results indicate that by providing such sealant 2123 to cover at least a part of the sensor electrode 2122, the magnetic flux detection sensitivity at the coil 2121 can be improved. The mechanism to improve this magnetic flux detection sensitivity is considered that the sealant 2123 with a relatively high magnetic permeability (higher than that of ambient air at least) can induce the magnetic flux, which may escape into air above the sensor electrode 2122 unless the sealant 2123 is placed, into the core 2120.

The first embodiment of the present invention has been explained above.

According to the first embodiment of the present invention, an extremely simple and low-cost configuration of the receiver 2, in which the magnetic flux induced by the electric current generated by the electric field is detected by using the coil 2121, can detect the electric field stably, as compared with the configuration, in which the strength of electric field is detected as the changes in polarization characteristics of electro-optical crystal.

In the meantime, for example, in the coil sensor 212, by connecting the sensor electrode 2122 with each core 2020 as being sandwiched between the cores 2120 of two coils 2121 as shown in FIG. 2c, or by connecting the sensor electrode 2122 with each core 2120 as being placed among the cores 2120 of three coils 2121 as shown in FIG. 3c, the coil sensor shown above can reduce the magnetic flux, which is escaped into air outside the coil 2121, can more sensitively detect the electric field coupled with the sensor electrode 2122. In this case, for example, there should be provided the electric current detecting circuit 2124 individually in each coil and the received signal generation circuit 2200 which generates received signals by adding each output from each electric current detecting circuit 2124.

The second embodiment of the present invention is explained below.

FIG. 4a shows the functional configuration of the communication system of this embodiment.

As shown in the figure, the communication system relating to the second embodiment of the present invention has the same configuration as that of the abovementioned first embodiment except that the receiving electrode 211 of the receiver 2 is removed.

FIG. 4b shows the external configuration of the receiver 2.

As shown in the figure, the receiver 2 has a configuration that the coil sensor 212, the demodulator 22 and the receiving side data processing unit 23 are housed in the single case 401. And just under the top surface of such case 401, the coil sensor 212 is placed such that the axis of the coil 2121 becomes perpendicular to the surface.

With such receiver 2, when a human hand is held over the case 401, the electro-magnetic field in the vicinity of the human body acts upon the coil sensor 212 placed just under the top surface of the case 401, generates electric current passing through the coil 2121. The electric current passing through the coil 2121 is then converted by the electric current detecting circuit 2124 of the coil sensor 212 to voltage signals, which are then transmitted to the demodulator 22 as received signals. As a result, the received signals, which correspond to the electro-magnetic field in the vicinity of the human body, namely the transmission signals of the transmitter 1, can be obtained.

The demodulator 22, then, demodulates the received signals via AM demodulation to communication information, and delivers it to the receiving side data processing unit 23, in which the communication information is processed.

The second embodiment of the present invention has been explained above.

According to the second embodiment of the present invention as explained above, the receiving electrode 211 can be excluded in the first embodiment.

The third embodiment of the present invention is explained below.

FIG. 5a shows the functional configuration of the communication system of the embodiment of the present invention.

As shown in the figure, the communication system according to this embodiment is equipped with the magnetic field detection antenna 501 and the magnetic field strength detecting unit 502 in the signal receiving unit 21 of the receiver 2, in place of the receiving electrode 211 and the coil sensor 212 of the communication system of the aforementioned first embodiment.

FIG. 5*b* shows the appearance of the receiver 2.

As illustrated in the figure, the receiver 2 has the antenna panel 503, which houses the magnetic field detection antenna 501, and the receiver chassis 504, which houses the magnetic field strength detecting unit 502, the demodulator 22 and the receiving side data processing unit 23. The magnetic field detection antenna 501 is of magnetic type, such as loop antenna, for example. As shown in the top view of the antenna panel 503 in FIG. 5*c* and the cross-sectional view of the antenna panel 503 in FIG. 5*d*, a human hand can be held over close to the antenna, which is placed inside the panel as it can detect a magnetic flux in vertical direction. Because of this structure, when a human hand is held over the panel unit 201 the magnetic field in the vicinity of the human body acts upon the magnetic field detection antenna 501.

According to such receiver 2, when a human hand is held over the antenna panel 503, the magnetic field in the vicinity of the human body acts upon the magnetic field detection antenna 501 placed inside the antenna panel 503 and makes the signals corresponding to the magnetic field pass through the magnetic field detection antenna 501. The magnetic field strength detecting unit 502 produces voltage signals indicating the strength of the magnetic field from the electric current passing through this magnetic field detection antenna 501 and sends them to the demodulator 22 as received signals. As a result, the signals corresponding to the magnetic field in the vicinity of human body, consequently the transmitted signals of the transmitter 1 are obtained as received signals.

The demodulator 22 demodulates the received signals to communication information by AM demodulation and delivers them to the receiving side data processing unit 23, in which the communication information is processed.

As the magnetic field detection antenna 501, a Hall element, which generates voltage signals corresponding to the magnetic field by the Hall effect, can be used. In this case, the magnetic field strength detecting unit 502 acts to detect the strength of the magnetic field from voltage signals generated by the Hall element.

The third embodiment of the present invention has been above explained.

According this third embodiment, since the magnetic field with less ambient noise than that of the electric field is used for the transmission between living body and the receiver, more stable communications than that using the electric field for transmission are achieved.

Although in every embodiment mentioned above, the transmission signals are applied to the human body via capacitance coupling from the transmitting electrode 13, they can be applied to the human body by bringing the transmitting electrode 13 into direct contact with the human body.

In the aforementioned first and second embodiments the receiver 2 can be configured to receive signals when a human hand is held over the receiving electrode 21 and coil sensor 212. Alternately, the receiver 2 can be configured to receive signals when a human hand is brought into direct contact with the receiving electrode 211.

In all of the above embodiments, materials other than human body, such as animal, plants and other conductive materials, may be used as the antenna 3.

DESCRIPTION OF NOTATIONS

Figure 1:
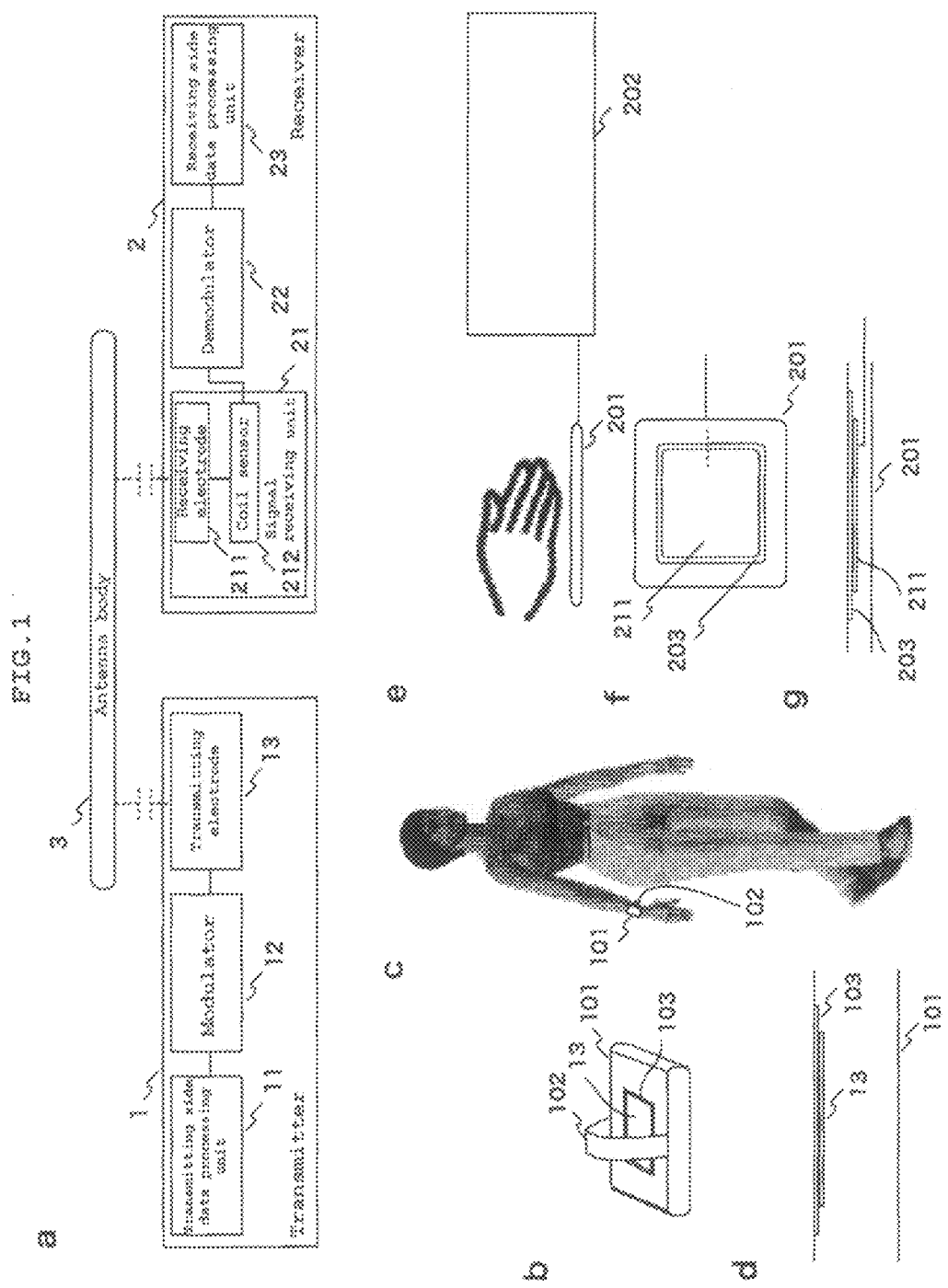
FIG. 1 A view showing the configuration of the communication system of the first embodiment of the present invention FIG. 2 A view showing the configuration of the coil sensor of the first embodiment of the present invention FIG. 3 A view showing the effect of the coil sensor sealant of the first embodiment of the present invention FIG. 4 A view showing the configuration of the communication system of the second embodiment of the present invention FIG. 5 A view showing the configuration of the communication system of the third embodiment of the present invention
Figure 2:
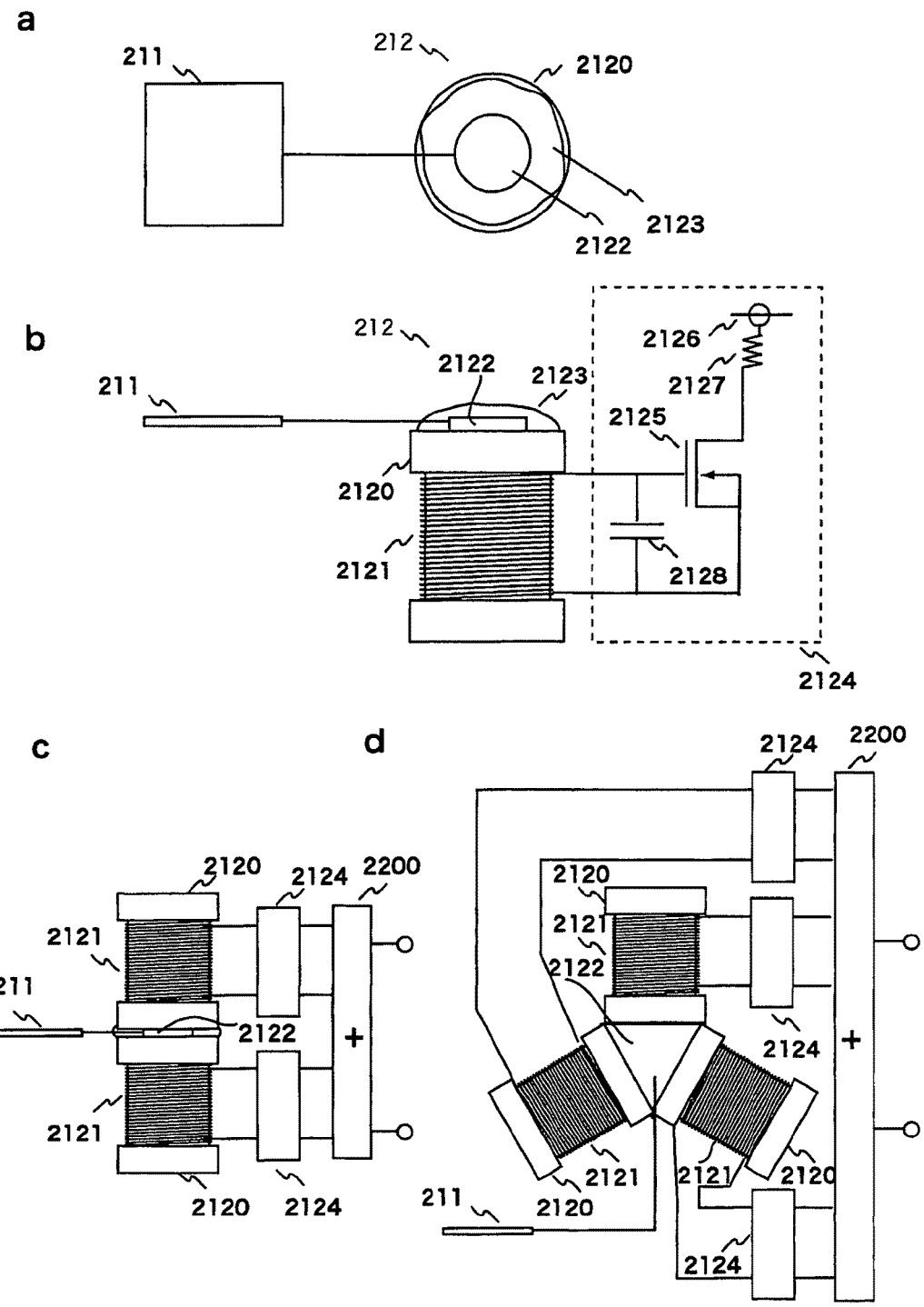
Figure 3:
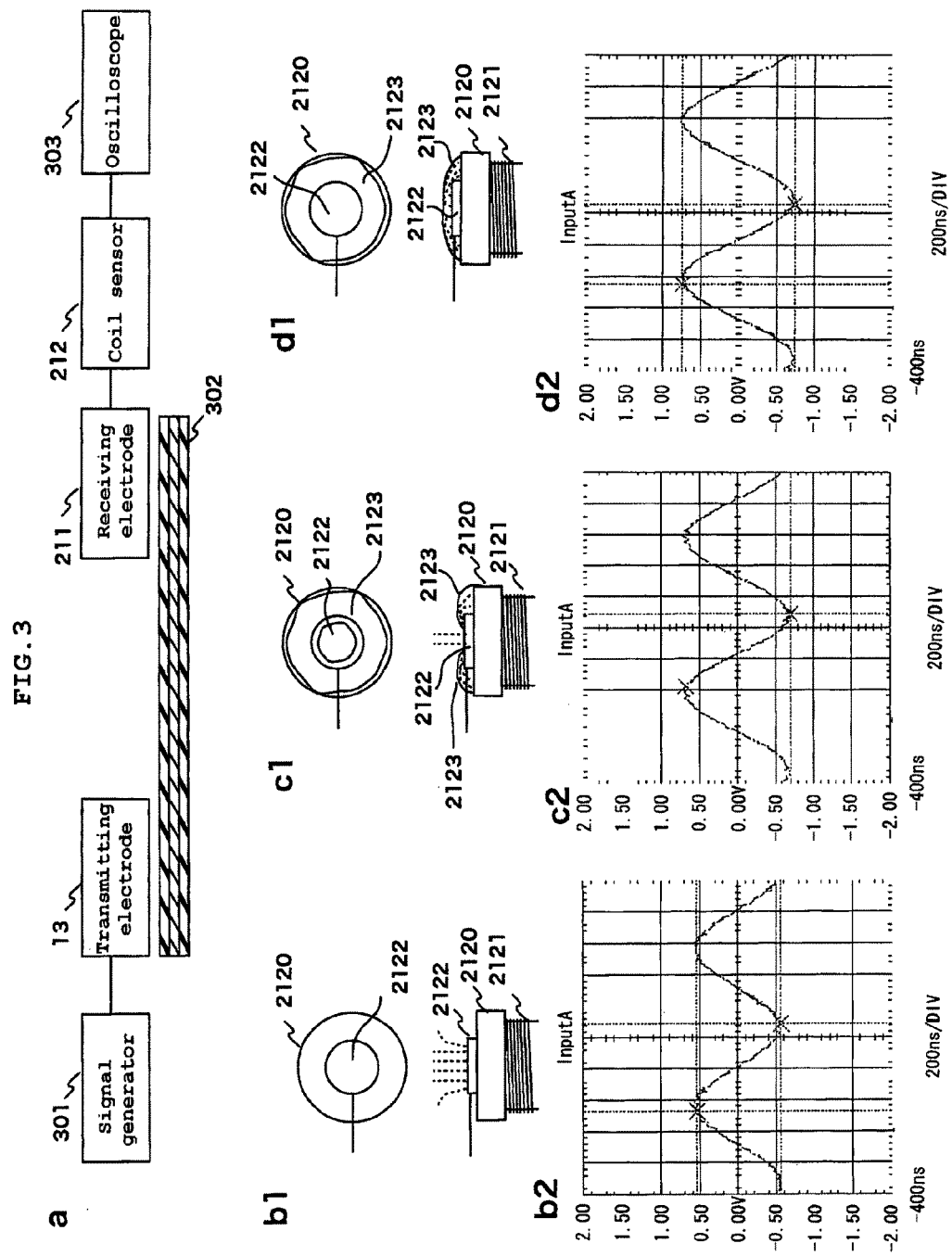
Figure 4:
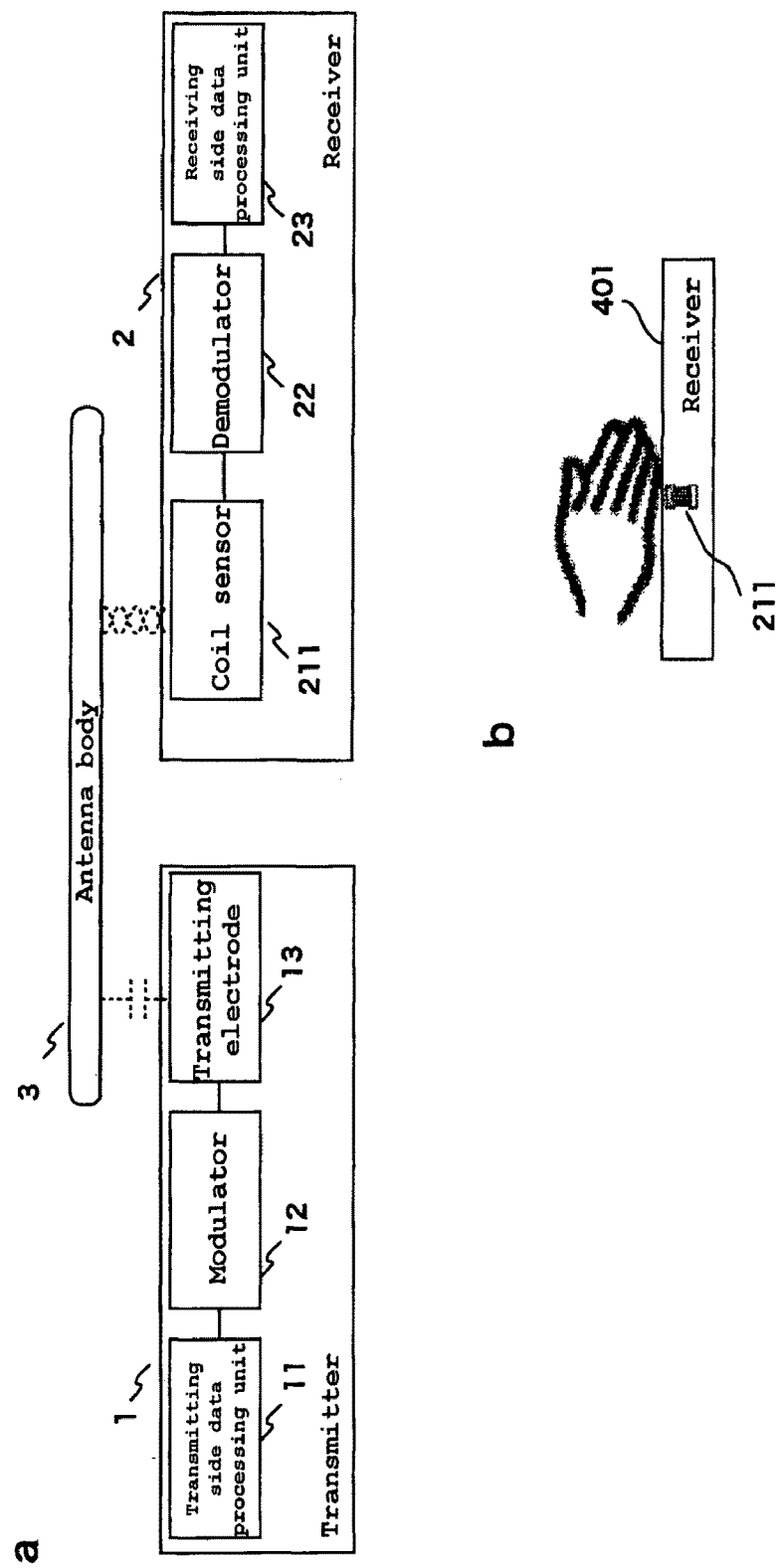
Figure 5:
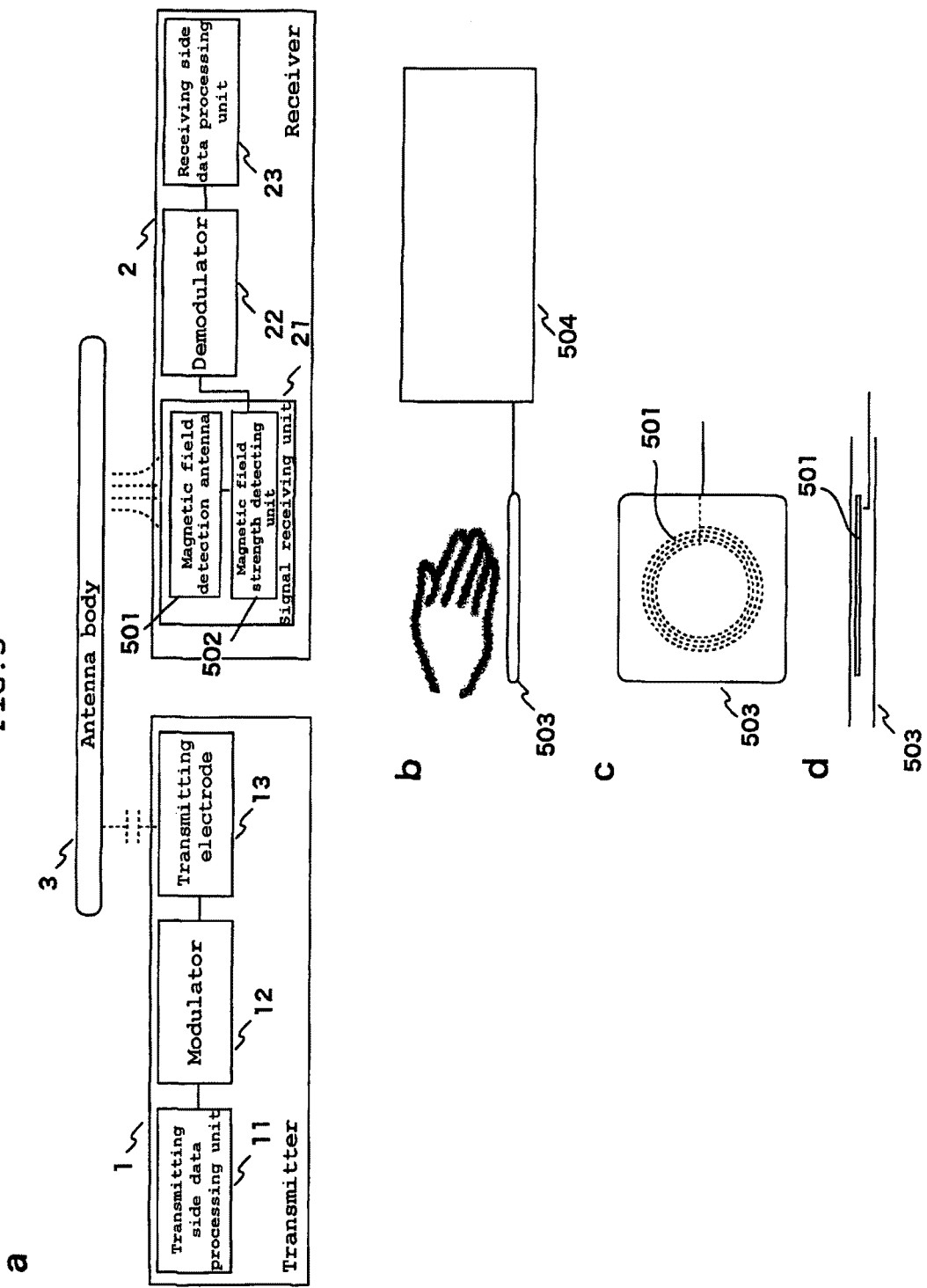

1 . . . Transmitter, 2 . . . Receiver, 3 . . . Antenna body, 11 . . . Transmitting side data processing unit, 12 . . . Modulator, 13 . . . Transmitting electrode, 21 . . . Signal receiving unit, 22 . . . Demodulator, 23 . . . Receiving side data processing unit, 101 . . . Transmitter main frame, 102 . . . Band, 201 . . . Panel unit, 202 . . . Receiver main frame unit, 211 . . . Receiving electrode, 212 . . . Coil sensor, 501 . . . Magnetic field detection antenna, 502 . . . Magnetic field strength detecting unit, 503 . . . Antenna panel, 2120 . . . Core, 2121 . . . Coil, 2122 . . . Sensor electrode, 2123 . . . Sealant, 2124 . . . Electric current detecting circuit, 2125 . . . FET, 2126 . . . Power source, 2127 . . . Resistance, 2128 . . . Condenser

The invention claimed is:

1. A communication system comprises a transmitter, which applies transmission signals produced by modulating communication information to the conductive transmission medium and induces an electric field in the vicinity of the transmission medium, and a receiver, which demodulates a detected strength of electric field into communication information, wherein the receiver comprises an a electric field detecting unit for detecting the strength of the electric field induced by the transmission medium, wherein the electric field detection unit unite comprises: a receiving electrode, which the transmission medium comes close to or contacts during communication between the transmitter and the receiver, a coil, a sensor electrode electrically isolated from the coil and placed close to a central opening of the coil, and a conductive wire connecting the receiving electrode and the sensor electrode, and wherein the coil outputs signals indicating the strength of the electric field acting upon the receiving electrode, wherein the electric field detecting unit has a magnetic body core inserted in the central opening of the coil and the sensor electrode is adhered to the end face of the magnetic body core.

2. The communication system according to claim 1, wherein the electric field detecting unit has a sealant with higher magnetic permeability than that of air to seal the entire sensor electrode or the periphery of the sensor electrode onto the magnetic body core.

3. The communication system according to claim 2, wherein the transmission medium is a human body or a living body.

4. The communication system according to claim 2, wherein the electric field detecting unit is equipped with plural pairs of the magnetic body core and the coil wound around the magnetic body core, and the sensor electrode is adhered to the end face of the magnetic body core of the pairs and is sandwiched between the end face of the magnetic body core of each pair of magnetic body core and the coil wound around the magnetic body core.

5. The communication system according to claim 4 wherein the transmission medium is a human body or a living body.

6. The communication system according to claim 1 wherein the transmission medium is a human body or a living body.

7. The communication system according to claim 2, wherein the transmission medium is a human body or a living body.

8. The communication system according to claim 1 wherein the electric field detection unit further comprises a current detecting circuit connected to opposing ends of the coil.

9. An electric field detecting device for detecting strength of an electric field, comprising: a receiving electrode located in the electric field; a coil; a sensor electrode electrically isolated from the coil and located near a central opening of the coil; and a conductive wire connecting the receiving electrode and the sensor electrode; and wherein the coil outputs signals indicative of the strength of the electric field acting on the receiving electrode and the electric field detecting device further comprising: a magnetic body core inserted in the central opening of the coil; and wherein the sensor electrode is adhered to an end face of the magnetic body core.

10. The electric field detecting device according to claim 9, further comprising: a sealant, with a higher magnetic permeability that that of air, sealing the entire sensor electrode or periphery of the sensor electrode onto the magnetic body core.

11. The electric field detecting device according to claim 9, further comprising: plural pairs of the magnetic body core and the coil wound around the magnetic body core; and wherein the sensor electrode is adhered to an end face of the magnetic body core of each pair and is sandwiched between the end face of the magnetic body core and the coil wound around the magnetic body core.

12. The electric field detecting device according to claim 9, further comprising a current detecting circuit connected to opposing ends of the coil.

* * * * *

UNITED STATES PATENT AND TRADEMARK OFFICE
CERTIFICATE OF CORRECTION

PATENT NO.        : 8,340,575 B2
APPLICATION NO.   : 11/883363
DATED             : December 25, 2012
INVENTOR(S)       : Yasuo Kato It is certified that error appears in the above-identified patent and that said Letters Patent is hereby corrected as shown below:

On the face of the patent, "PCT/JP2006/001103" should read -- PCT/JP2006/301103 --.

Column 8, line 34 (claim 1, line 7), "an a" should read -- an --.

Cancel claim 7.

Signed and Sealed this
Fifth Day of March, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,340,575 B2  
APPLICATION NO. : 11/883363  
DATED : December 25, 2012  
INVENTOR(S) : Yasuo Kato Page 1 of 1

It is certified that error appears in the above-identified patent and that said Letters Patent is hereby corrected as shown below:

ON THE TITLE PAGE

Item (86) "PCT/JP2006/001103" should read -- PCT/JP2006/301103 --.

Below Abstract, "12 Claims, 5 Drawing Sheets" should read -- 11 Claims, 5 Drawing Sheets --.

IN THE CLAIMS

Column 8, line 34 (claim 1, line 7), "an a" should read -- an --.

Column 9, lines 4-6, cancel claim 7.

This certificate supersedes the Certificate of Correction issued March 5, 2013.

Signed and Sealed this  
Ninth Day of April, 2013

Teresa Stanek Rea  
*Acting Director of the United States Patent and Trademark Office*